(12) United States Patent
Benwadih et al.

(10) Patent No.: US 9,196,820 B2
(45) Date of Patent: Nov. 24, 2015

(54) PIEZOELECTRIC PRESSURE SENSOR HAVING PIEZOELECTRIC MATERIAL COVERING ELECTRODES

(71) Applicant: Commissariat A l'Energie Atomique Et Aux Energies Alternatives, Paris (FR)

(72) Inventors: Mohammed Benwadih, Champigny sur Marne (FR); Abdelkader Aliane, Grenoble (FR)

(73) Assignee: Commissariat A L'Energie Atomique Et Aux Energies Alternatives, Paris (FR)

( * ) Notice: Subject to any disclaimer, the term of this patent is extended or adjusted under 35 U.S.C. 154(b) by 0 days.

(21) Appl. No.: 14/178,762

(22) Filed: Feb. 12, 2014

(65) Prior Publication Data

US 2014/0191221 A1     Jul. 10, 2014

Related U.S. Application Data

(63) Continuation of application No. PCT/FR2012/051843, filed on Aug. 3, 2012.

(30) Foreign Application Priority Data

Sep. 14, 2011   (FR) ...................... 11 58179

(51) Int. Cl.
| | | |
|---|---|---|
| H01L 29/84 | (2006.01) |
| H01L 29/788 | (2006.01) |
| G01P 15/08 | (2006.01) |
| H01L 21/00 | (2006.01) |
| H01L 41/193 | (2006.01) |
| G01L 9/00 | (2006.01) |
| G01L 9/06 | (2006.01) |
| G01L 9/08 | (2006.01) |
| G01L 1/16 | (2006.01) |
| H01L 41/113 | (2006.01) |
| H01L 41/00 | (2013.01) |
| H02N 2/00 | (2006.01) |

(52) U.S. Cl.
CPC ................ *H01L 41/193* (2013.01); *G01L 1/16* (2013.01); *G01L 9/008* (2013.01); *G01L 9/06* (2013.01); *G01L 9/08* (2013.01); *H01L 41/1132* (2013.01)

(58) Field of Classification Search
None
See application file for complete search history.

(56) References Cited

U.S. PATENT DOCUMENTS

| | | | | |
|---|---|---|---|---|
| 4,378,510 A | * | 3/1983 | Bennett | 310/329 |
| 2009/0127977 A1 | * | 5/2009 | So et al. | 310/322 |
| 2011/0137184 A1 | * | 6/2011 | Ren et al. | 600/485 |

FOREIGN PATENT DOCUMENTS

WO       2010/022038 A2       2/2010

OTHER PUBLICATIONS

International Search Report dated Nov. 26, 2012.

*Primary Examiner* — Michael Jung
(74) *Attorney, Agent, or Firm* — Burr & Brown, PLLC

(57) ABSTRACT

A pressure sensor including a lower substrate having two electrodes partially covered with a semiconductor layer and a piezoelectric layer made of a piezoelectric material, and in contact with the semiconductor layer in such a way that semiconductor material is in contact with the piezoelectric material and with the two electrodes, deposited thereon. The electrodes are intended to be connected to a voltage source or to a device for measuring the intensity of a current generated by the displacement of the electric charges in the semiconductor layer between the electrodes, said electric charges being created when a pressure is exerted on the piezoelectric layer.

17 Claims, 5 Drawing Sheets

PIEZOELECTRIC PRESSURE SENSOR HAVING PIEZOELECTRIC MATERIAL COVERING ELECTRODES

BACKGROUND OF THE INVENTION

The present invention relates to a pressure sensor, and more specifically, to a pressure sensor comprising a piezoelectric material.

FIELD OF THE INVENTION

To measure a pressure, that is, a force applied to a surface, it is well known to use different types of pressure sensors.

The most current pressure sensors are strain gauge sensors. Such sensors operate by implementing a piezoresistive effect, that is, the effect of a pressure on the characteristics of a resistor called strain gauge. The geometric variation of a strain gauge translates as a variation of its resistance. Such sensors comprise four strain gauges, such as a wire gauge, a foil strain gauge, or a semiconductor gauge, for example, assembled as a Wheatstone bridge on a deformable proof body. The variations of the gauge resistances then enable to determine the pressure exerted on the proof body.

However, even though such pressure sensors are robust and reliable, they have a low sensitivity.

Pressure sensors of variable capacitance, formed of a diaphragm, of a static metal plate, of an insulating material, and of a dielectric are also known. The capacitance between the two metal plates, that is, the diaphragm and the static plate, is modified as the distance separating them varies, that is, when a pressure is exerted on the diaphragm.

This type of variable-capacitance pressure sensor enables to measure the capacitance variation between a metallic diaphragm and a fixed metal plate, and is generally very stable and linear; however, such capacitances are sensitive to high temperatures and are more complex to install than most pressure sensors.

Finally, piezoelectric pressure sensors, which operate according to the piezoelectric principle, are also known. Thus, a piezoelectric material, such as quartz, for example, electrically charges when said material is submitted to mechanical strain such as a pressure. The electric charge is proportional to the force which is exerted on the piezoelectric material and is measured in picofarads.

Thus, to measure a pressure by means of a piezoelectric pressure sensor, the voltage appearing across the piezoelectric material has to be measured.

However, it is particularly difficult to measure small voltage variations, so that such piezoelectric pressure sensors are considered as having a low sensitivity, that is, as being unable to measure low pressures or low pressure variations.

SUMMARY OF THE INVENTION

One of the aims of the invention is to overcome the disadvantages of such piezoelectric pressure sensors by providing a pressure sensor comprising a piezoelectric material of simple and inexpensive design and providing a high measurement sensitivity.

For this purpose and according to the invention, a pressure sensor comprising a piezoelectric material is provided. This sensor comprises a lower substrate having two electrodes partially covered with a semiconductor layer deposited thereon, a piezoelectric layer being positioned in contact with the semiconductor layer in such a way that semiconductor material is in contact with the piezoelectric material and with the two electrodes. The piezoelectric layer is systematically in contact with the electrodes. Said electrodes are intended to be connected to a voltage source or to a device for measuring the intensity of a current generated by the displacement of the electric charges in the semiconductor layer between electrodes, said electric charges being created when a pressure is exerted on the piezoelectric layer.

It should be understood that the pressure sensor according to the invention enables to transfer the charges, created when a pressure is exerted on the piezoelectric layer, into a semiconductor which is in electric contact therewith.

The application of a voltage between the two previously-mentioned electrodes enables to transfer the charges into the semiconductor and to recover an electric current proportional to the applied pressure, the current measurement being much more reliable than the voltage measurement used in prior art piezoelectric sensors.

According to an embodiment of the invention, the sensor further comprises a dielectric layer made of a dielectric material, locally inserted between the piezoelectric layer and the semiconductor layer.

According to an advantageous feature of the pressure sensor according to the invention, the piezoelectric layer comprises dipoles aligned along the direction of the exerted pressure, which enables to increase the number of collected charges, and thus to increase the sensor sensitivity. Such an alignment may be performed only once before the sensor use. The dipoles of the piezoelectric layer are advantageously aligned by application of an electric field between judiciously-selected electrodes.

Preferably, the electric field applied between the electrodes is in the range from 0.3 and 0.7 volt per micrometer at a temperature in the range from 40 to 60° C. for a time period between 20 minutes and 8 hours. Indeed, the temperature improves the charge mobility, so that the alignment is obtained more rapidly and/or more completely.

Further, the lower substrate is advantageously made of a material selected from the group comprising glass, doped or undoped silicon, polymers such as polyethylene terephthalate (PET), polyethylene naphthalate (PEN), polyimides (PI), polycarbonate, acrylates, etc.

Preferably, the semiconductor layer is made of a material selected from the group comprising:
 semiconductor organic molecules such as tetracene, pentacene, phthalocyanine,
 semiconductor polymers such as polythiophene, polyfluorene, polyphenylene vinylene or derivatives thereof such as poly(3-octyl), thiophene, poly[2-methoxy-5-(2'-ethyl-hexyloxy)-1,4-], phenylene, vinylene or oligomer such as α-sexithiophenes.

Further, the piezoelectric layer is advantageously made of a material selected from the group comprising polyfluoridevinylidene (fluorinated polyvinylidene), polyvinylidene-fluoride copolymers, and LZT (Lead-Zinc-Titanium oxide).

In particularly advantageous fashion, the pressure sensor according to the invention further comprises:
 a dielectric layer deposited on the semiconductor layer,
 a gate electrode deposited on the upper surface of the dielectric layer,
 an insulating layer deposited on the upper layer of the dielectric layer and the gate electrode,
the piezoelectric layer being deposited over the semiconductor layer/dielectric layer/gate electrode/insulating layer assembly, in such a way that piezoelectric material is in contact with the semiconductor material and the two electrodes.

Such a pressure sensor then has a "high-gate"-type field-effect transistor structure, so that a same component may be used as a transistor when no pressure is applied on the piezoelectric layer and becomes a sensitive pressure sensor when a pressure is applied on said piezoelectric layer.

Preferably, the dielectric material is made of a material selected from the group comprising silicon dioxide, silicon nitrate, titanium dioxide, aluminum oxide, hafnium oxide, polyimides, polyvinyls, pyrrolidone, polymethylmethacrylate, polyamide, parylene, polystyrene and fluoropolymers.

Further, the electrodes are made of a material selected from the group comprising metals such as aluminum, titanium, nickel, gold, chromium, etc...., metal particles, metal oxides such as indium-tin oxide, indium-zinc oxide, etc...., conductive polymers such as 3,4-polyethylene dioxythiophene-polystyrene, sulfonate (PEDOT:PSS) or polyaniline, etc...., or doped silicon materials.

BRIEF DESCRIPTION OF THE DRAWINGS

The foregoing and other features and advantages will be discussed in detail in the following non-limiting description of specific embodiments of the pressure sensor comprising a piezoelectric material according to the invention, in connection with the accompanying drawings, among which.

DETAILED DESCRIPTION OF THE INVENTION

Figure 1:
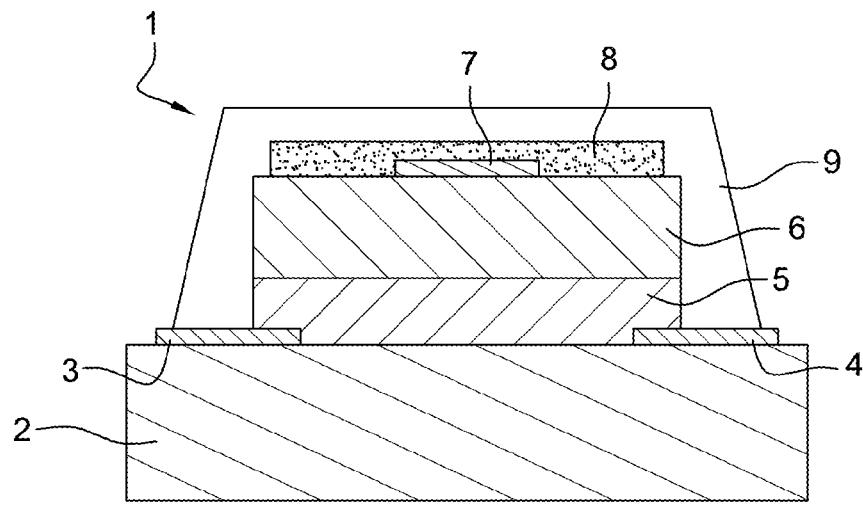
FIG. 1 is a simplified cross-section view of a pressure sensor comprising a piezoelectric material according to the invention.

For clarity, in the following description, the same elements have been designated with the same reference numerals in the different drawings. Further, the various cross-section views are not necessarily drawn to scale.

Figure 2:
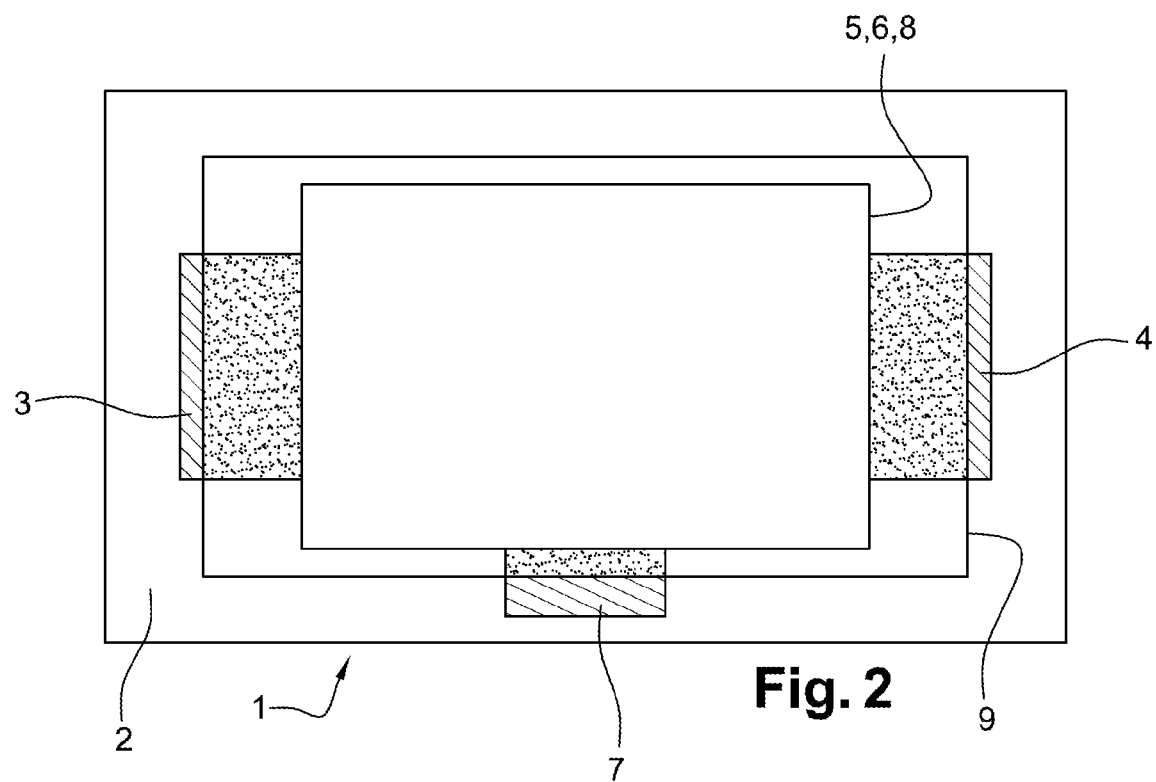
FIG. 2 is a simplified top view of the pressure sensor of FIG. 1, FIGS. 3A to 3C are simplified representations of the different steps of measuring the pressure exerted on the piezoelectric layer of the pressure sensor according to the invention.

Referring to FIGS. 1 and 2, pressure sensor 1 according to the invention comprises a lower substrate 2, having two electrodes 3, 4 deposited thereon, respectively a source electrode 3 and a drain electrode 4.

Lower substrate 2 is made of a material selected from the following list: glass, doped or undoped silicon substrate, polymers such as polyethylene terephthalate (PET), polyethylene naphthalate (PEN), polyimide (PI), polycarbonate, acrylates, etc.

It should however be obvious that lower substrate 2 may be obtained in any other material well known by those skilled in the art.

Further, source and drain electrodes 3 and 4 are made of metal, such as aluminum, titanium, nickel, gold, chromium, etc...., or of metal particles, of metal oxides such as indium-tin oxide, indium-zinc oxide, etc...., or even of conductive polymers such as 3, 4-polyethylene dioxythiophene-polystyrene, sulfonate (PEDOT:PSS), polyaniline, etc...., of doped silicon or of any other appropriate conductive material well known by those skilled in the art.

Said source and drain electrodes 3 and 4 are partially covered with a semiconductor layer 5 made of a semiconductor material. Further, a dielectric layer 6 made of a dielectric material is deposited on semiconductor layer 5.

Said semiconductor layer 5 is advantageously made of a semiconductor organic material such as tetracene, pentacene, phthalocyanine, semiconductor polymers such as polythiophene, polyfluorene, polyphenylene vinylene or derivatives thereof such as poly(3-octyl), thiophene, poly[2-methoxy-5-(2'-ethyl-hexyloxy)-1,4-], phenylene, vinylene or oligomer such as α-sexithiophenes.

However, semiconductor layer 5 may also be made of a semiconductor inorganic material well known by those skilled in the art such as silicon or gallium arsenide (GaAs) for example, without for all this departing from the context of the invention.

Said dielectric layer 6 is made of silicon dioxide, silicon nitrate, titanium dioxide, aluminum oxide, hafnium dioxide, or again of polyimide, polyvinyl, pyrrolidone, polymethylmethacrylate, polyamide, parylene, polystyrene, fluoropolymers, or of any dielectric material well known by those skilled in the art.

The sensor further comprises a gate electrode 7, deposited on the upper surface of dielectric layer 6. Gate electrode 7 and dielectric layer 6 are covered with an insulating layer 8 providing an electric insulation.

A piezoelectric layer 9 made of a piezoelectric material, is deposited on the assembly formed by insulating layer 8, dielectric layer 6 and semiconductor layer 5, in such a way that semiconductor material of semiconductor layer 5 is in contact, on the one hand, with the piezoelectric material of piezoelectric layer 9 and, on the other hand, with source, drain, and gate electrodes 3, 4, and 7.

Piezoelectric layer 9 is electrically insulated from gate electrode 7.

Gate electrode 7 is made of a material of same nature as that forming source and drain electrodes 3 and 4.

Insulating layer 8 is obtained by deposition of a dielectric material selected from the materials forming layer 6 (cf. supra), and piezoelectric layer 9 is made of a material selected from the following list: polyvinylidene fluoride (PVDF), polyvinylidene fluoride copolymers such as PVDF-TrFE or PVDF-TFE, or of any other material having piezoelectric properties well known by those skilled in the art.

Piezoelectric layer 9 preferably has a thickness in the range from 1 to 40 micrometers, said thickness especially depending on the value of the pressure to be measured, that is, on its order of magnitude, and on the nature of the piezoelectric material forming piezoelectric layer 9. It will be within the abilities of those skilled in the art to adapt the thickness of the piezoelectric layer according to these two factors.

Further, piezoelectric layer 9 comprises aligned dipoles, said dipoles being aligned in the direction of the pressure to be measured. After the deposition of piezoelectric layer 9, the dipoles are disordered. To align the dipoles of piezoelectric layer 9, an electric field E is applied between two electrodes, source electrode 3 and drain electrode 4, for example, at a value in the range from $0.3\ V\cdot m^{-1}$ to $0.7\ V\cdot m^{-1}$ per micrometer of the thickness of piezoelectric layer 9, at a temperature between 40 and 60° C. and for a duration in the range from 20 minutes to 8 hours.

It can be observed that pressure sensor 1 thus defined has a "high-gate" and "low contact" field-effect organic transistor structure. Thus, when no pressure is exerted on said sensor, the latter may advantageously operate normally as a field-effect organic transistor.

The operation of pressure sensor 1 according to the invention will be explained hereafter based on an embodiment, in relation with FIGS. 3A to 3C, 4 and 5.

Figure 3A:
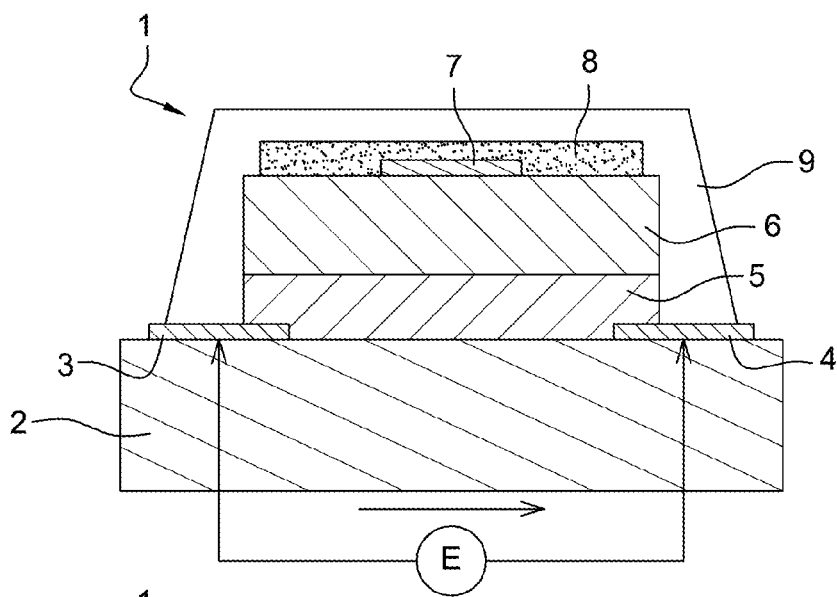

Referring to FIG. 3A, pressure sensor 1 is obtained by deposition of 3 nanometers of gold on a polyethylene naphthalate (PEN) substrate having a thickness of approximately 125 micrometers. The gold layer is then etched to define a source electrode 3 and a drain electrode 4.

A semiconductor layer 5 made of triisopropylsilyl (TIPS) pentacene having a thickness of approximately 90 nanometers, partially covering source and drain electrodes 3 and 4, is then deposited by photogravure. This layer is then covered with a dielectric layer 6 made of fluoropolymer sold under trade name CYTOP® for example with a thickness of approximately 800 nanometers.

Then, 50 nanometers of gold are deposited on said dielectric layer 6 to form gate electrode 7, followed by the deposition of an insulating layer made of CYTOP® by a thickness of approximately 1 micrometer, after which a piezoelectric layer 9 made of polyvinylidene fluoride (PVDF) or of a polyvinylidene fluoride copolymer such as PVDF-TrFE or P(VDF-TFE) is deposited by a thickness of approximately 1 micrometer.

To align the dipoles of piezoelectric layer 9 in order to allow a lateral pressure measurement, that is, for the measurement of a pressure exerted on a lateral edge of piezoelectric layer 9, an electric field E is applied between source and drain electrodes 3 and 4. Electric field E has a 0.5-V/μm intensity and it is applied at a 50° C. temperature for 30 minutes.

Figure 3B:
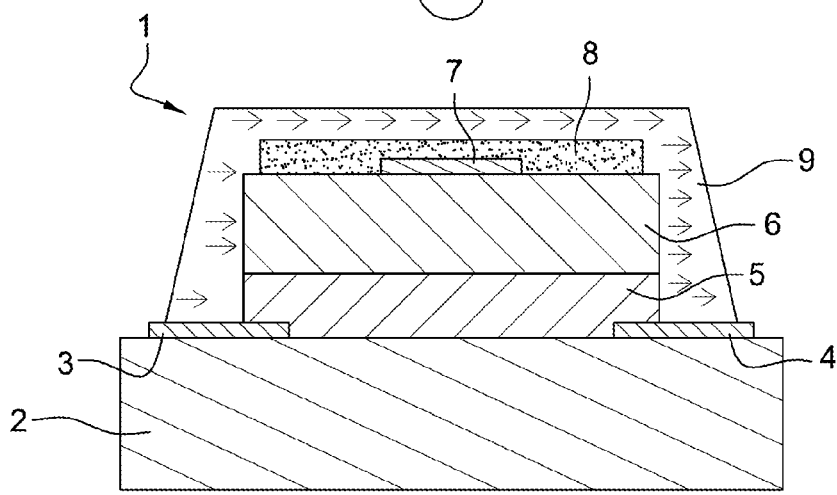

Referring to FIG. 3B, the dipoles of piezoelectric layer 9 are then aligned parallel to lower substrate 2.

Figure 3C:
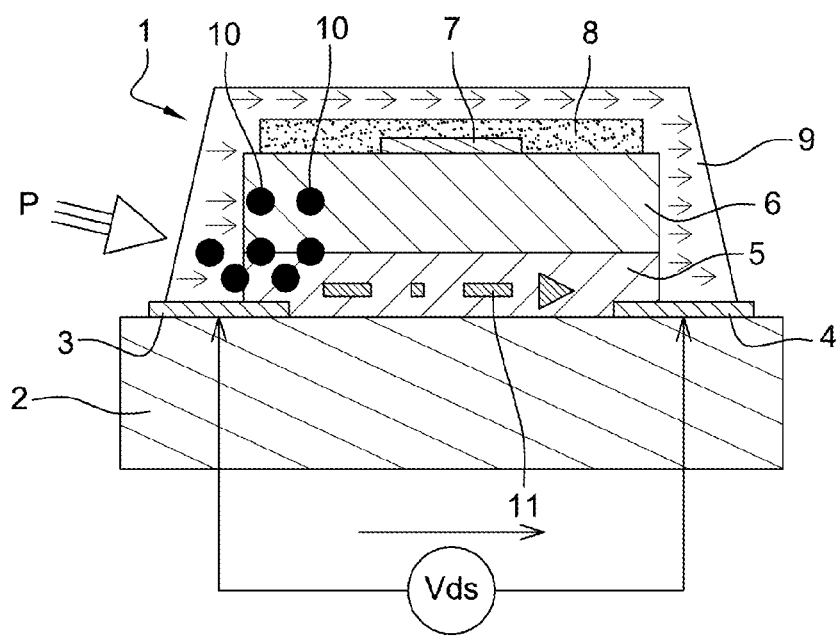

When a pressure is exerted on one of the lateral edges of piezoelectric layer 9, referring to FIG. 3C, charges 10 create in said piezoelectric layer at the level of the pressure point. By applying a voltage called $V_{DS}$ between drain electrode 4 and source electrode 3, charges 10 are transferred into semiconductor layer 5 and flow through conduction channel 11 located between source electrode 3 and drain electrode 4.

The displacement of charges 10 in conduction channel 11 of semiconductor layer 5 induces an increase of current $I_{DS}$ measured across source and drain electrodes 3 and 4.

Figure 4:
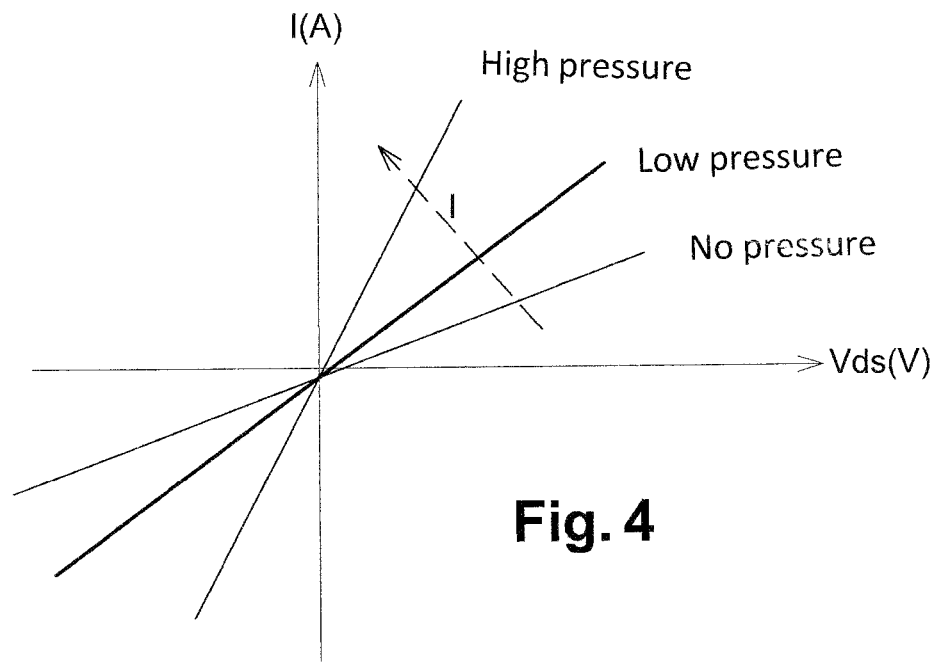
FIG. 4 is a graphical representation of the intensity of the current according to the voltage measured across the electrodes of the pressure sensor according to the invention.

As can be seen in FIG. 4, current $I_{DS}$ measured across source and drain electrodes 3 and 4 is proportional to the pressure exerted on the lateral edge of piezoelectric layer 9. Thus, an increase in the lateral pressure exerted on piezoelectric layer 9 generates a proportional increase of current $I_{DS}$ by charge build-up and transport in conduction channel 11 of semiconductor layer 5.

Figure 5:
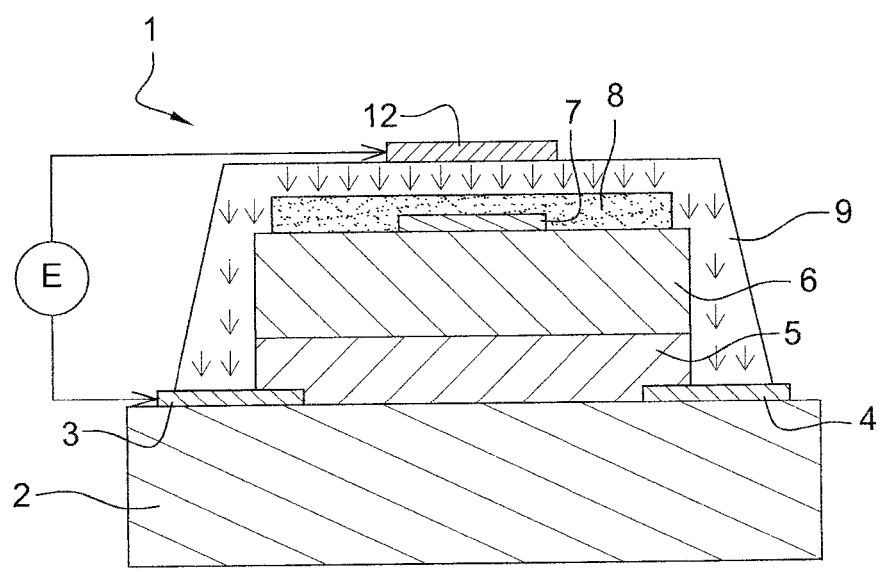
FIG. 5 is a simplified representation of an alternative execution of the biasing of the piezoelectric layer of the pressure sensor according to the invention.

To enable to measure a vertical pressure, referring to FIG. 5, it is previously necessary to vertically align the dipoles of piezoelectric layer 9. For this purpose, an electrode 12 is positioned on the upper surface of piezoelectric layer 9, after which an electric field E is applied between said electrode 12 and electrode 3, or between electrode 12 and electrode 4, or even between electrode 12 and electrodes 3 and 4. Electric field E has a 0.5-V/μm intensity and it is applied at 50° C. for from 30 minutes to several hours.

The dipoles of piezoelectric layer 9 are then vertically aligned. When a pressure is exerted on the upper surface of piezoelectric layer 9, charges 10 create in piezoelectric layer 9 at the level of the pressure point.

By applying a voltage called $V_{DS}$ between drain electrode 4 and source electrode 3, in the same way as previously, charges 10 are transferred into semiconductor layer 5 and flow through conduction channel 11 located between source electrode 3 and drain electrode 4. The displacement of charges 10 in conduction channel 11 of the semiconductor layer generates an increase of current $I_{DS}$ measured across source and drain electrodes 3 and 4, said increase of current $I_{DS}$ being proportional to the pressure exerted on the upper surface of piezoelectric layer 9.

It should be noted that to vertically align the dipoles of piezoelectric layer 9, gate electrode 7 may be used to apply electric field E instead of electrode 12. However, the dipole alignment will then not be perfectly vertical and the dipoles of piezoelectric layer 9 are capable of creating stray capacitances which alter the sensor performance, when the latter operates as a transistor, that is, when no pressure is exerted on the upper surface of the piezoelectric layer.

Figure 6:
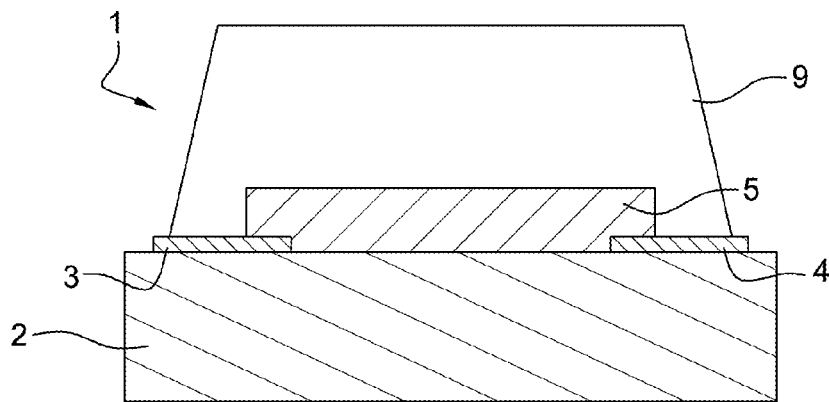
FIG. 6 is a simplified cross-section view of an alternative execution of the pressure sensor according to the invention.
Figure 7:
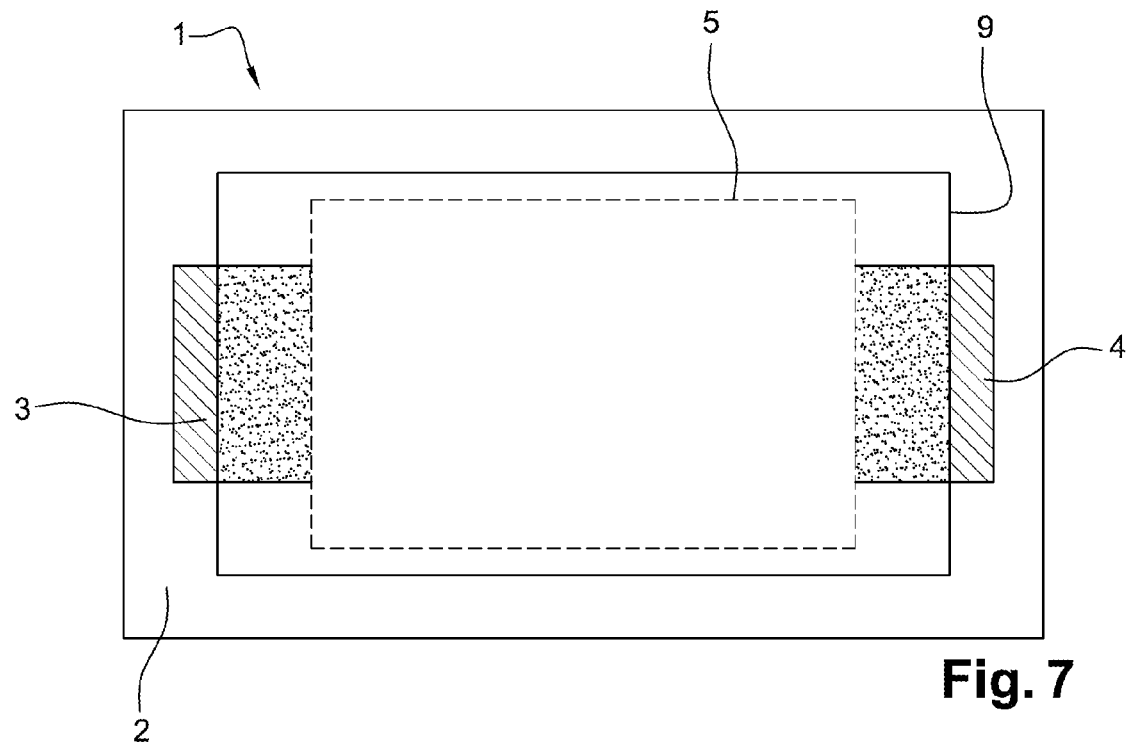
FIG. 7 is a simplified top view of FIG. 6.

According to an alternative embodiment of the pressure sensor according to the invention, and referring to FIGS. 6 and 7, piezoelectric layer 9 is deposited on semiconductor layer 5, in such a way that piezoelectric material of said layer 9 is in contact, on the one hand, with the semiconductor material of semiconductor layer 5 and, on the other hand, with source and drain electrodes 3 and 4.

Figure 8:
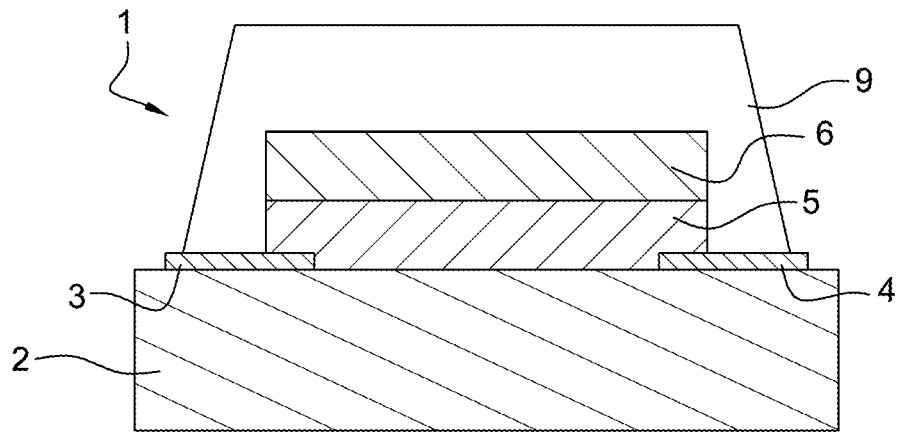
FIG. 8 is a view similar to FIG. 6, of an alternative execution of the invention.

According to an alternative execution shown in FIG. 8, a dielectric layer 6 is introduced between piezoelectric layer 9 and semiconductor layer 5. Thereby, the following operating modes are available:
- a so-called "sensor" mode operation, like for the embodiment shown in relation with FIG. 6;
- a so-called "transistor" operation, when piezoelectric layer 9 plays the role of the gate. The usual modulation of the gate voltage here is a pressure modulation on the piezoelectric layer, which, by capacitive effect, opens more or less the charge transport channel between electrodes 3 and 4.

As previously, piezoelectric layer 9 comprises aligned dipoles, said dipoles being aligned in the direction of the pressure to be measured. To align the dipoles of piezoelectric layer 9, an electric field E is applied between source electrode 3 and drain electrode 4, for example, at an intensity in the range from 0.3 to 0.7 V·m$^{-1}$ per micrometer of the thickness of piezoelectric layer 9, at a temperature between 40 and 60° C. and for a duration between 20 minutes and 8 hours.

The sensor operation is strictly identical to the operation of the previously-described sensor, except that this alternative execution of the pressure sensor is not capable of operating as an organic field-effect transistor.

Figure 9:
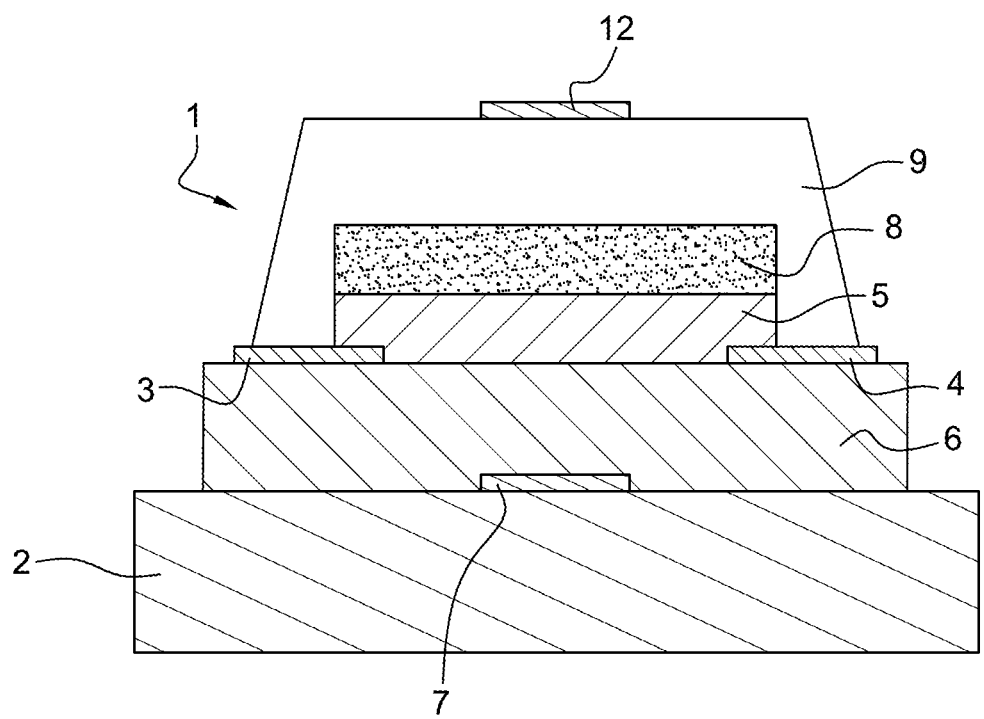
FIG. 9 is a view similar to FIG. 1, illustrating a pressure sensor in "low-gate" transistor mode.

Finally, it should be obvious that the examples which have just been given are specific illustrations only and that they by no means limit the fields of application of the invention. It is thus possible to form a pressure sensor according to the invention with a "low gate" transistor structure, as shown in FIG. 9.

The invention claimed is:

1. A pressure sensor comprising a piezoelectric material, wherein the pressure sensor comprises at least:
   one lower substrate having two electrodes, partially covered with a semiconductor layer made of a semiconductor material, deposited on the lower substrate and in direct contact with the two electrodes,
   and a piezoelectric volume made of the piezoelectric material, wherein the piezoelectric volume is in direct contact with the semiconductor layer and with the two electrodes,
   wherein the two electrodes are capable of being connected to a voltage source or to a device for measuring the intensity of a current generated by the displacement of electric charges in the semiconductor layer between the two electrodes, said electric charges being created when a pressure is exerted on the piezoelectric volume.

2. The pressure sensor of claim 1, wherein the semiconductor layer comprises a face, opposite to the lower substrate, and wherein the pressure sensor further comprises a dielectric layer made of a dielectric material arranged in direct contact with said face of the semiconductor layer.

3. The pressure sensor of claim 2, wherein the dielectric layer is made of a material selected from the group comprising silicon dioxide, silicon nitrate, titanium dioxide, aluminum oxide, hafnium dioxide, polyimides, polyvinyl, pyrrolidone, polymethylmethacrylate, polyamide, parylene, polystyrene, and fluoropolymers.

4. The pressure sensor of claim 1, wherein the pressure sensor comprises a dielectric layer made of a dielectric material deposited on a face of the semiconductor layer opposite to the lower substrate, a gate electrode deposited on an upper face of the dielectric layer opposite to the semiconductor layer, an insulating layer deposited on an upper surface of the dielectric layer opposite to the dielectric layer and the gate electrode, the piezoelectric volume being deposited on the semiconductor layer/dielectric layer/gate electrode/insulating layer assembly in such a way that piezoelectric material is in direct contact only with the semiconductor material and the two electrodes.

5. The pressure sensor of claim 4, wherein the insulating layer is made of a material selected from the group comprising silicon dioxide, silicon nitrate, titanium dioxide, aluminum oxide, hafnium dioxide, polyimides, polyvinyl, pyrrolidone, polymethylmethacrylate, polyamide, parylene, polystyrene, and fluoropolymers.

6. The pressure sensor of claim 1, wherein the piezoelectric volume comprises constant dipoles aligned along a direction of the exerted pressure.

7. The pressure sensor of claim 6, wherein the pressure sensor comprises a third electrode in direct contact with the piezoelectric volume, and wherein the third electrode is capable of being connected to a voltage source.

8. The pressure sensor of claim 1, wherein the lower substrate is made of a material selected from the group comprising glass, polycarbonate, doped or undoped silicon, polymers such as polyethylene terephthalate (PET), polyethylene naphthalate (PEN), polyimide (PI), and acrylates.

9. The pressure sensor of claim 1, wherein the semiconductor layer is made of a material selected from the group comprising semiconductor organic molecules such as tetracene, pentacene, phthalocyanine, semiconductor polymers such as polythiophene, polyfluorene, polyphenylene vinylene or derivatives thereof such as poly(3-octyl), thiophene, poly [2-methoxy-5-(2'-ethyl-hexyloxy)-1,4-], phenylene, vinylene or oligomer such as α-sexithiophenes.

10. The pressure sensor of claim 1, wherein the piezoelectric layer is made of a material selected from the group comprising polyvinylidene fluoride (PVDF), polyvinylidene fluoride copolymers such as PVDF-TrFE or PVDF-TFE, and LZT (Lead-Zinc-Titanium oxide).

11. The pressure sensor of claim 1, wherein the two electrodes are made of a material selected from the group comprising metals such as aluminum, titanium, nickel, gold or chromium, metal particles, metal oxides such as indium-tin oxide or indium-zinc oxide, conductive polymers such as 3,4-polyethylene dioxythiophene-polystyrene sulfonate (PEDOT:PSS) or polyaniline or doped silicon materials.

12. The pressure sensor according to claim 1, wherein the substrate has a planar face onto which the two electrodes are arranged, and wherein the piezoelectric volume has dipoles aligned along a direction parallel to the planar face of the substrate.

13. The pressure sensor according to claim 1, wherein the substrate has a planar face onto which the two electrodes are arranged, and wherein the piezoelectric volume has dipoles aligned along a direction perpendicular to the planar face of the substrate.

14. A method for manufacturing a pressure sensor according to claim 1, comprising:
providing a lower substrate having two electrodes, partially covered with a semiconductor layer made of a semiconductor material, deposited on the lower substrate and in direct contact with the two electrodes,
providing a piezoelectric volume made of a piezoelectric material, wherein the piezoelectric volume is in direct contact with the semiconductor layer and with the two electrodes, wherein the two electrodes are capable of being connected to a voltage source or to a device for measuring the intensity of a current generated by the displacement of electric charges in the semiconductor layer between the two electrodes, said electric charges being created when a pressure is exerted on the piezoelectric volume,
applying an electric field E between the two electrodes deposited on the lower substrate.

15. A method according to claim 14, wherein the electric field E applied between the electrodes is in the range from 0.3 and 0.7 volt per micrometer at a temperature in the range from 40 to 60° C. for a time period between 20 minutes and 8 hours.

16. A method for manufacturing a pressure sensor according to claim 1, comprising:
providing a lower substrate having two electrodes, partially covered with a semiconductor layer made of a semiconductor material, deposited on the lower substrate and in direct contact with the two electrodes,
providing a piezoelectric volume made of a piezoelectric material, wherein the piezoelectric volume is in direct contact with the semiconductor layer and with the two electrodes, wherein the two electrodes are capable of being connected to a voltage source or to a device for measuring the intensity of a current generated by the displacement of electric charges in the semiconductor layer between the two electrodes, said electric charges being created when a pressure is exerted on the piezoelectric volume,
providing a third electrode in direct contact with the piezoelectric volume, the third electrode is capable of being connected to a voltage source,
applying an electric field E between the third electrode and one or the other of the two electrodes deposited on the lower substrate.

17. A method according to claim 16, wherein the electric field E applied between the electrodes is in the range from 0.3 and 0.7 volt per micrometer at a temperature in the range from 40 to 60° for a time period between 20 minutes and 8 hours.

* * * * *